US011549832B2

(12) United States Patent
May et al.

(10) Patent No.: US 11,549,832 B2
(45) Date of Patent: Jan. 10, 2023

(54) EXPLOSION MANAGEMENT AND METHODS THEREOF

(71) Applicant: ABB SCHWEIZ AG, Baden (CH)

(72) Inventors: Michael J. May, Bartlesville, OK (US); Don Adams, Bartlesville, OK (US); Brian C. Smith, Tulsa, OK (US); Tony E. Moore, Bartlesville, OK (US); Brian J. Robertson, Bartlesville, OK (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/345,751

(22) Filed: Jun. 11, 2021

(65) Prior Publication Data

US 2022/0397434 A1 Dec. 15, 2022

(51) Int. Cl.
*G01D 11/24* (2006.01)
*G01D 11/30* (2006.01)

(52) U.S. Cl.
CPC ........... *G01D 11/245* (2013.01); *G01D 11/30* (2013.01)

(58) Field of Classification Search
CPC .............................. G01D 11/245; G01D 11/30
See application file for complete search history.

(56) References Cited

U.S. PATENT DOCUMENTS

| 1,482,049 | A | | 6/1922 | Swanson | |
| 8,602,245 | B2 | * | 12/2013 | Manahan | B65D 45/02 |
| | | | | | 248/231.71 |
| 10,117,548 | B2 | | 11/2018 | Babikian et al. | |
| 10,177,548 | B2 | * | 1/2019 | Ledgerwood | H02G 3/14 |
| 2013/0083824 | A1 | * | 4/2013 | Bronczyk | G01K 1/02 |
| | | | | | 374/208 |
| 2017/0062168 | A1 | * | 3/2017 | Amirthasamy | H01H 13/063 |
| 2019/0331511 | A1 | | 10/2019 | Kawashima | |
| 2021/0308509 | A1 | * | 10/2021 | Hermanowski | H05K 7/20309 |

FOREIGN PATENT DOCUMENTS

| CN | 2157507 Y | * | 2/1994 |
| CN | 207201115 U | * | 4/2018 |
| EP | 1130363 A1 | | 9/2001 |
| WO | 2020032946 A1 | | 2/2020 |
| WO | 2020036597 A1 | | 2/2020 |

OTHER PUBLICATIONS

"Clamped EBMX", Product Brochure, Eaton, Publication No. 5270-0216, dated Feb. 2016, 8 pages.
International Search Report and Written Opinion for International Application No. PCT/US2022/032970, dated Sep. 9, 2022, 16 pages.

* cited by examiner

*Primary Examiner* — Jamel E Williams
(74) *Attorney, Agent, or Firm* — Armstrong Teasdale LLP

(57) ABSTRACT

Devices, systems, and methods for explosion resistance include an analysis compartment isolated from a control compartment. A feed-through extends between the analysis compartment and the control compartment for extension of cabling therethrough, the feed-through hermetically sealed to block against flow of fluids between the analysis and control compartments.

22 Claims, 10 Drawing Sheets

EXPLOSION MANAGEMENT AND METHODS THEREOF

TECHNICAL FIELD

The present disclosure relates to the field of explosion management. More particularly, the present disclosure relates to explosion management in instrumentation.

BACKGROUND

Field instruments, such as sensors and/or analyzers, can be important to various industrial devices, systems, and/or methods. In environments which involve or potentially involve explosive substances, such as alcohols and/or petroleum products, hazards of igniting the explosive substance can exists.

For example, instruments themselves may be involved with explosive substances, such as sensors for a production process, whether the explosive substances are within the precursor, intermediate product, incidental product, and/or final product. Additionally, the field environment for such instruments can themselves contain explosive substances, for example, gases, which could be ignited by the electronic equipment of the instruments and/or generally by an explosion originating from within the instruments. Accordingly, explosion management can be challenging.

SUMMARY

According to an aspect of the present disclosure, an explosion-resistant enclosure may include an analysis compartment for receiving analysis equipment for analysis of materials, a control compartment for receiving control equipment for governing operation of analysis equipment, the control compartment isolated from the analysis compartment, and a feed-through extending between the analysis compartment and the control compartment for extension of cabling therethrough. The feed-through may be hermetically sealed to block against flow of fluids between the analysis and control compartments.

In some embodiments, one or more of the feed-through, the analysis compartment, and the control compartment may be explosion resistant. The control compartment may comprise a control housing defining a control cavity for receiving control equipment and an access opening for accessing the control cavity. The control compartment may include a lid for joining with the housing to enclose the access opening.

In some embodiments, the control housing may include an end member for engagement with the lid. The access opening may be defined by the end member. The end member may be supported by a flange wall extending from the control housing. The end member may extend orthogonally from the flange wall to define an end face for engagement with the lid.

In some embodiments, the flange wall may include a receptacle defined on an outer surface thereof for receiving a clamp. At least one of the flange wall and the lid may include a sloped surface extending circumferentially for engagement with the clamp. The end member may engage with the lid to define a flame gap extending circumferentially about the access opening.

In some embodiments, the analysis compartment may include a clamp for securing the lid with the housing. The clamp may include a number of clamp arms extending circumferentially about each of the lid and the end member. Each of the clamp arms may include circumferential ends. The circumferential ends of a pair of clamp arms may be selectively fastened with each other to clamp the lid and the end member together.

In some embodiments, each one of the pair of clamp arms may include another circumferential end. The another circumferential ends of the pair of clamp arms may be pivotably coupled together. In some embodiments, the clamp may include a fastener. The fastener may be arranged pivotably coupling the clamps arms together. The fastener may be secured with a housing of the enclosure to support the clamp arms for movement between an open position free from the end member and a closed position clamped about the end member to clamp the lid and the end member together.

In some embodiments, the clamp may include a radial depression for receiving a circumferential portion of each of the lid and end member. The radial depression may be defined with one or more inwardly sloped surfaces of the clamp. Each inwardly sloped surface may be arranged for engagement with one of the lid and end member to press the lid and end member together under radially inward pressure of the clamp. In some embodiments, at least one of the flange wall and the lid may include an outwardly sloped surface extending circumferentially for engagement with the one or more inwardly sloped surfaces of the clamp to press the lid and end member together under radially inward pressure of the clamp.

In some embodiments, the lid may include a cable passage for extension of interface cabling therethrough. The cable passage may define a flame gap.

In some embodiments, the lid may be defined as a part of a lid assembly comprising a display screen for graphical display. The display screen may include cabling extending through the cable passage for communication with the control equipment. The display screen may include a touch screen for receiving touch sensitive user input.

According to another aspect of the present disclosure, an explosion-resistant device may include an explosion-resistant enclosure, analysis equipment for analysis of samples, the analysis equipment arranged within the explosion-resistant enclosure, and control equipment for governing control of the analysis equipment. The explosion-resistant enclosure may include an analysis compartment receiving the analysis equipment; a control compartment receiving the control equipment, and a feed-through. The control compartment may be isolated from the analysis compartment. The feed-through may extend between the analysis compartment and the control compartment for extension of cabling therethrough. The feed-through may be hermetically sealed to block against flow of fluids between the analysis and control compartments.

According to another aspect of the present disclosure, an explosion-resistant device may include an explosion-resistant enclosure comprising (i) an analysis compartment for receiving analysis equipment for analysis of materials, (ii) a control compartment for receiving control equipment, the control compartment isolated from the analysis compartment, and (iii) a feed-through extending between the analysis compartment and the control compartment for extension of cabling; and a lid assembly. The lid assembly may include (i) a lid for enclosing an opening of the explosion-resistant enclosure and (ii) a graphical display assembly for presenting visual information regarding the analysis equipment.

In some embodiments, the lid may include a cable passage for extension of display cabling therethrough. The cable passage may include an opening in a body of the lid and a passage fitting formed complementary to the opening to define a flame gap. The flame gap may be cylindrical. In some embodiments, the passage fitting may extend through the opening in the body of the lid with axial engagement with the surface of the opening along a longitudinal extent to define the flame gap.

In some embodiments, the lid assembly may include a clamp for clamping around the circumference of the lid to secure the lid with the explosion-resistant compartment. The clamp may be arranged circumferentially about the lid and an end member of the explosion-resistant compartment to secure the lid with the explosion-resistant compartment.

In some embodiments, the graphical display assembly may include a transparent outer face plate and an inner display. The inner display may be covered by the face plate. The graphical display assembly may include a display housing for housing the display. The display housing may be secured with the lid.

In some embodiments, the display housing may include a front bezel and a rear housing collectively defining an interior compartment for housing the display. The graphical display assembly may be formed as a touchscreen user interface. The outer face plate may define a touch sensitive interface for receiving user input.

In some embodiments, the display may include display cabling extending therefrom for communication with the analysis equipment. The display cable may extend through a cable passage defined within the lid for connection with the analysis equipment. The cable passage may be sealed to block against passage of explosive substance therethrough. Sealing may be provided by potting.

According to another aspect of the present disclosure, an explosion-resistant device may include an explosion-resistant enclosure comprising at least one compartment for receiving equipment and a lid assembly. The lid assembly may include a lid for enclosing an opening of the explosion-resistant enclosure. The lid may be clamped to the enclose the compartment by a clamp. The lid assembly may include a graphical display assembly for presenting visual information regarding the analysis equipment.

According to another embodiment of the present disclosure, an explosion-resistant enclosure lid assembly may include a lid for enclosing an opening of an explosion-resistant enclosure, and a graphical display assembly for presenting visual information regarding the analysis equipment. The graphical display assembly may be joined with the lid.

In some embodiments, the graphical display assembly may include a touch screen display and a display housing receiving the display. The display housing may be connected with the lid. The lid may include a cable passage for extension of touch screen display cabling therethrough. The cable passage may include an opening in a body of the lid and a passage fitting formed complementary to the opening to define a flame gap. The passage fitting may extend through the opening in the body of the lid with axial engagement with the surface of the opening along a longitudinal extent to define the flame gap.

These and other features of the present disclosure will become more apparent from the following description of the illustrative embodiments.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

Figure 1:
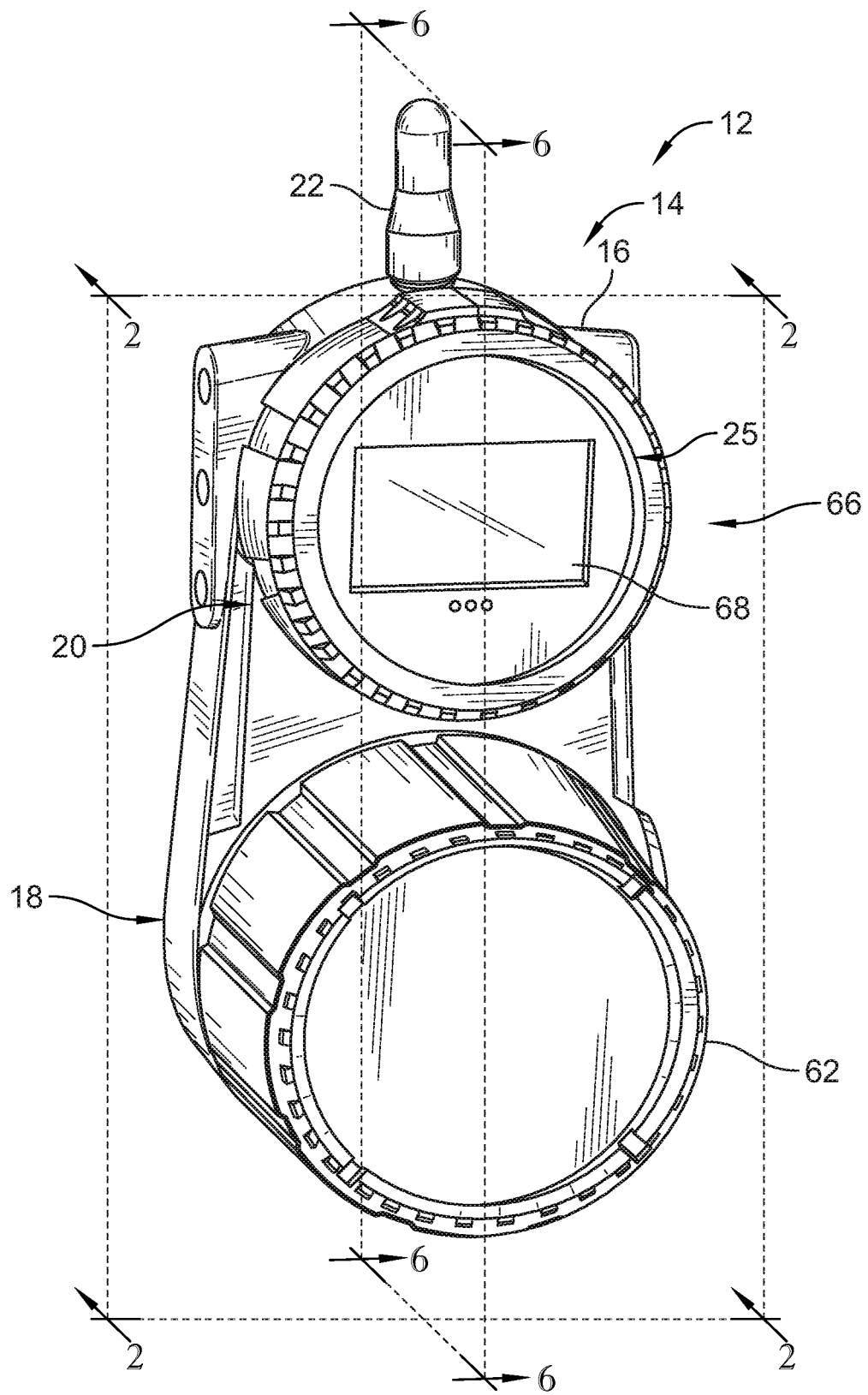
FIG. 1 is a perspective view of an explosion-resistant device including an explosion-resistant enclosure having an analysis compartment for analysis equipment and a control compartment for control equipment.

While the concepts of the present disclosure are susceptible to various modifications and alternative forms, specific embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

In various industrial scenarios, electronic instrumentation can assist in high quality, safe, and/or efficient process management. In scenarios involving explosive and/or flammable substances, whether those substances are the intended final product or may otherwise exist (intentionally or not) at some point in a process to generate the final product, the risk of explosion and/or flame can exist. In particular, in using electronic equipment to conduct field analysis of process substances with flammability and/or explosion risks, the electronics themselves can pose a risk of ignition. For example, flammable and/or explosive gases to be analyzed may be ignited if allowed in contact with electronic equipment, such as control boards and/or circuitry internal to the instrumentation. Within the present disclosure, the resistance to explosion and/or flammability risks, including from electronic instrumentation, is described as explosion resistance.

Additionally, electronic instrumentation may exist in external environments which may have risk the presence of flammable and/or explosive substances, such as in petrochemical production facilities. Thus, in addition to the hazards of instrumentation generating internal ignition, electronic instrumentation can pose further risk to external environments. Accordingly, the design of instrumentation to manage explosion and/or flammability risks can be challenging.

Still further, control equipment, such as the electronic components for governing control of analysis equipment, can require more frequent, sporadic, and/or time-sensitive maintenance (e.g., repair and/or replacement). Ease of access to such control equipment is important to practical operations. However, robust explosion-resistant designs can inhibit ease of access to instrument internals. Thus, providing ease of access in proper explosion resistant designs can be challenging.

An exemplary instrumentation device 12 is shown in FIG. 1. The instrumentation device 12 is illustratively formed as an electronic analyzer, embodied to conduct gas chromatography to determine properties of a subject substance of a production process. As discussed in additional detail herein, the instrumentation device 12 includes electronic equipment housed within an explosion-resistant enclosure 14. The electronic equipment can include any suitable manner of equipment, but is illustratively embodied to include gas chromatography equipment.

The explosion-resistant enclosure 14 includes a housing 16 defining an interior for receiving equipment therein. The housing 16 illustratively includes an analysis compartment 18 for receiving analysis equipment, and a control compartment 20 for receiving control equipment. The enclosure 14 illustratively includes an antenna 22 for communicating wireless signals, for example, Wi-Fi signals, although in some embodiments, the device 12 may be partly or wholly wired for communication.

As shown in FIG. 1, the device 12 includes a graphical display assembly 25 for presenting visual information. As discussed in additional detail herein, the display assembly 25 includes a display screen 68 embodied as a touch screen display enabled for touch interaction to receive user input. Traditional explosion-resistant devices can include designs which lack or have challenges implementing touch screen displays due to the need for explosion-resistant design in the display itself. The robustness of traditional explosion-resistant designs can inhibit the functionality of the touch screen.

Figure 2:
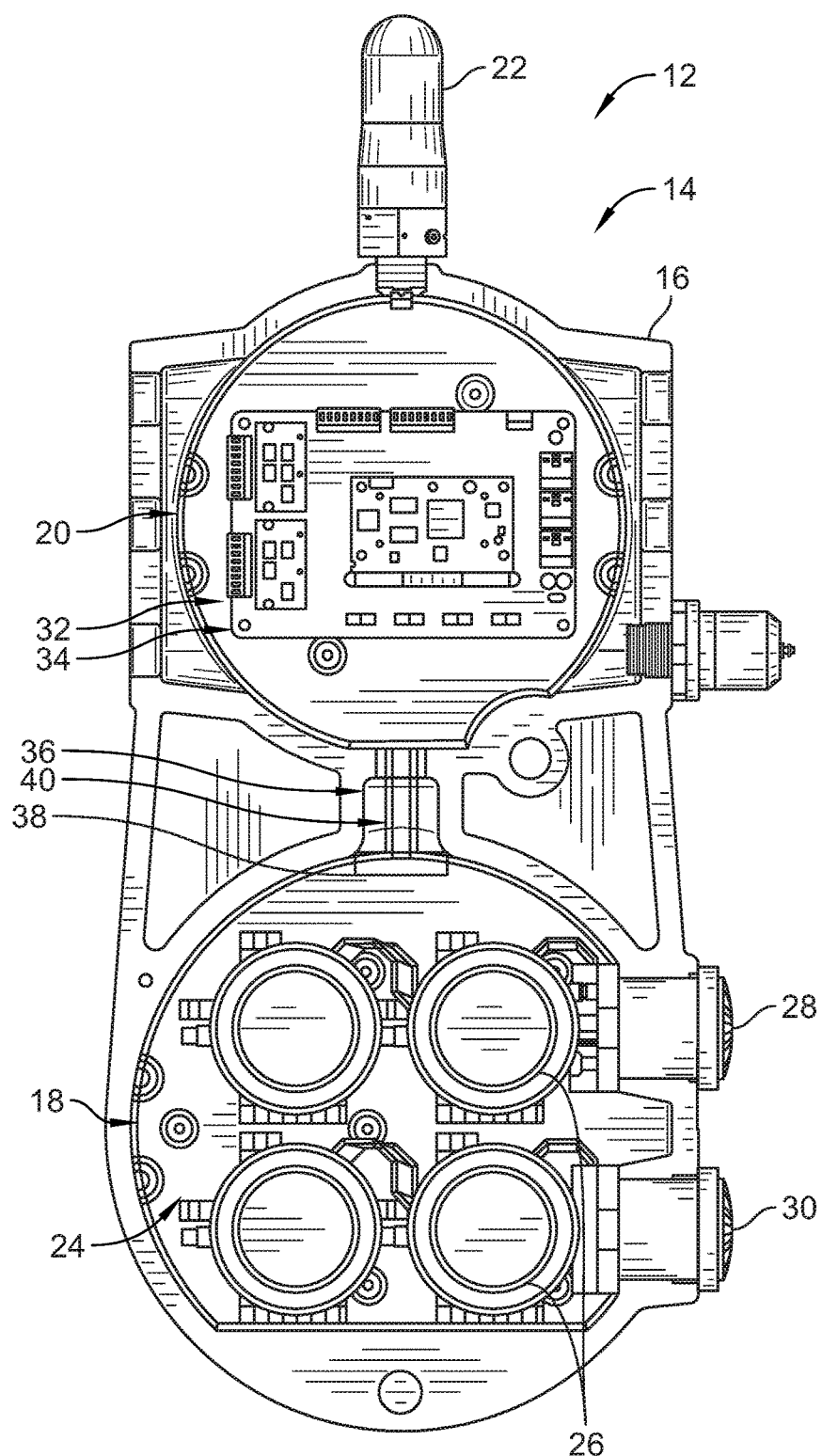
FIG. 2 is a cross-sectional view of the explosion-resistant device of FIG. 1 taken along the plane 2-2, showing that analysis equipment is received within the analysis compartment and control equipment is received within the control compartment, and showing that a feed-through extends between the analysis and control compartments for extension of cabling, but is hermetically sealed to block against flow of fluids between the compartments.

Referring now to FIG. 2, a portion of the enclosure 14 has been removed to reveal internals within the analysis compartment 18 and the control compartment 20. In the illustrative embodiment as shown in FIG. 2, the analysis compartment 18 defines an analysis cavity 24 therein. The analysis compartment 18 receives analysis equipment within the analysis cavity 24, the analysis equipment illustratively embodied to include gas chromatography analysis modules 26 for conducting gas chromatography analysis, and may include one or more regulators, samplers, detectors, chromatograms and/or other equipment operated under guidance of the control equipment. The analysis modules 26 are illustratively arranged in communication with ports 28, 30 of the enclosure 14 through the analysis compartment 18. The ports 28, 30 are illustratively defined as input and output ports for receiving and returning (external) substances for analysis by the analysis modules 26.

Referring still to FIG. 2, the control compartment 20 defines a control cavity 32 therein. The control compartment 20 receives control equipment within the control cavity 32, the control equipment illustratively embodied as control circuitry 34. The control circuitry 34 is illustratively embodiment as control circuitry for governing control and/or communication of gas chromatography processing; and may including one or more processors executing instructions stored on memory, and executing communications via communications circuitry based on guidance from the processor(s) for conducting gas chromatography operations. The control equipment is formed to conduct control operations for the analysis equipment. For example, the control equipment provides the governing control commands for operation of the analysis modules 26.

The analysis compartment 18 is isolated from the control compartment 20 to assist in explosion-resistance. By isolating the analysis equipment within the analysis compartment 18 from the control equipment within the control compartment 20, the enclosure 14 can reduce the likelihood of ignition of substances within the analysis compartment 18, providing enhanced explosion-resistance. Any would-be ignition (or existence of explosion substance) occurring within the analysis compartment 18 can be less likely to spread outside of the analysis compartment 18, providing enhanced explosion-resistance. Similarly, any would-be ignition (or existence of explosion substance) within the control compartment 20 can be less likely to spread beyond the analysis compartment 18.

A feed-through 36 illustratively extends between the analysis and control compartments 18, 20 for extension of cabling 40 therethrough. The feed-through 36 is formed as a narrow, sealed channel allowing extension of cabling 40 to communicate between the control equipment and the analysis equipment, but blocking against flow communication of substances (e.g., fluids) between the compartments 18, 20. In the illustrative embodiment, the feed-through 36 is hermetically sealed to block against communication of substances.

In the illustrative embodiment, the feed-through 36 includes the cabling 40 extending therethrough and potted into place to seal the feed-through 36. A connection terminal 38 is illustratively defined on an end of the feed-through 36 within the analysis compartment 18. The connection terminal 38 includes the cabling 40 connected therewith and extending from the control compartment 20. The connection terminal 38 is illustratively arranged for selectively receiving connection with the analysis modules 26.

In some embodiments, the connection terminal 38 may be omitted and the cabling 40 may be hardwired with the analysis modules 26. In some embodiments, a printed circuit board assembly may be arranged within the analysis compartment for connection with the connection terminal 38 to provide additional connections with the analysis equipment. In some embodiments, the cabling 40 may include a terminal connection on the control compartment side to receive selective connection with the control equipment.

Figure 3:
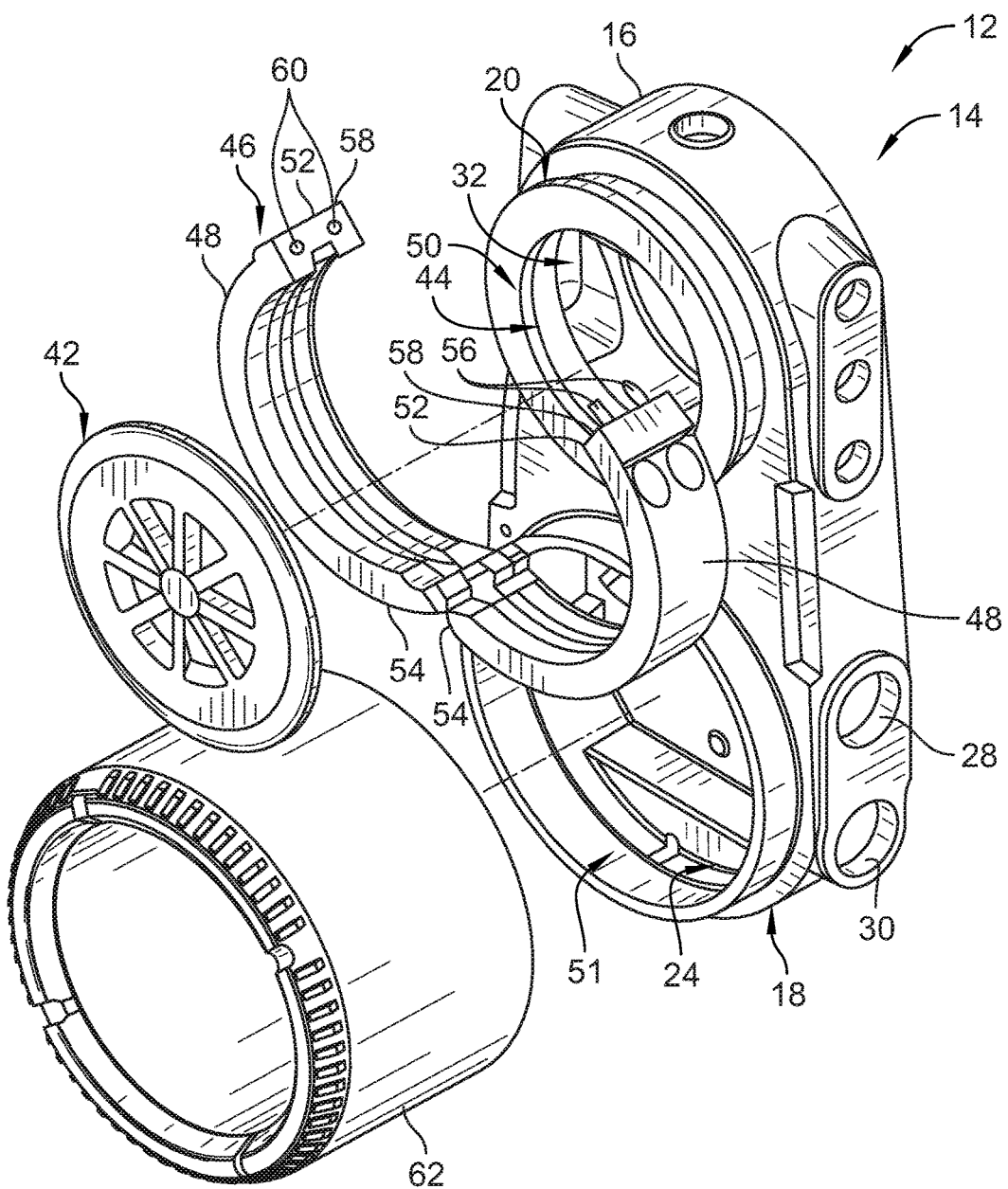
FIG. 3 is an exploded perspective view of the explosion-resistant device of FIGS. 1 and 2, showing that the control compartment includes a lid arranged for clamping by a clamp with a housing of the enclosure to enclose an access opening of the control compartment.

Referring now to FIG. 3, the enclosure 14 includes a lid assembly including a lid 42 for enclosing an access opening 44 of the control compartment 20. The lid 42 is selectively joined with the control compartment 20 via a clamp 46 of the lid assembly to seal the control compartment 20. A user can selectively operate the clamp 46 between locked and unlocked positions to access or seal the control compartment 20, while the analysis compartment 18 remains isolated.

The control compartment 20 includes the access opening 44 providing access to the control cavity 32. The access opening 44 is defined by an end member 50 of the control compartment 20 embodied as an end flange. The end flange 50 engages with the lid 42 to seal the access opening 44 of the control compartment 20.

The clamp 46 is operable in a closed position (as suggested in FIG. 1) to clamp the lid 42 and control compartment 20 together, and an open position (as suggested in FIG. 3) to permit removal of the lid 42 for access within the control compartment 20. The clamp 46 is illustratively formed with two clamp arms 48. The clamp arms 48 are formed to secure (clamp) circumferentially about the lid 42 and the end flange 50 of the control compartment 20 to join the lid 42 and the control compartment 20 together by compression.

Each clamp arm 48 includes a terminal end 52 arranged at one end and another terminal end 54 arranged at the opposite end. The clamp arms 48 each extend between their terminal ends 52, 54 with curvature complementary to a portion of the circumference of the lid 42 and end flange 50. In the illustrative embodiment, the terminal ends 54 are pivotably engaged with each other such that the clamp arms 48 can pivot between the open and closed positions of the clamp 46 while remaining engaged together.

The terminal ends 52 of the clamp arms 48 are selectively connected with each other to secure the clamp 46 in the closed position. The terminal end 52 of one of the clamp arms 48 illustratively includes a pair of fasteners 56, embodied as bolts, extending from an end face 58 of the terminal end 52. The terminal end 52 of the other of the clamp arms 48 illustratively includes a complementary pair of receivers 60 extending through an end face 58 for receiving connection of the fasteners 56. The fasteners 56 illustratively thread into the receivers 60 to join the end faces 58 together to secure the clamp 46 in the closed position. In some embodiments, the clamp arms 48 may be secured together by any suitable manner of fastener.

The analysis compartment 18 includes a lid 62 shown disconnected from the housing 16 in FIG. 3. The lid 62 is illustratively formed to connect with the analysis compartment 18 by threading to seal an access opening 51 of the analysis compartment 18. The lid 62 of the analysis compartment is distinct from the lid 42 of the control compartment 20. Accordingly, the analysis compartment 18 can be accessed without requiring access to the control compartment 20, and the control compartment 20 can be accessed without requiring access to the analysis compartment 18.

Figure 4:
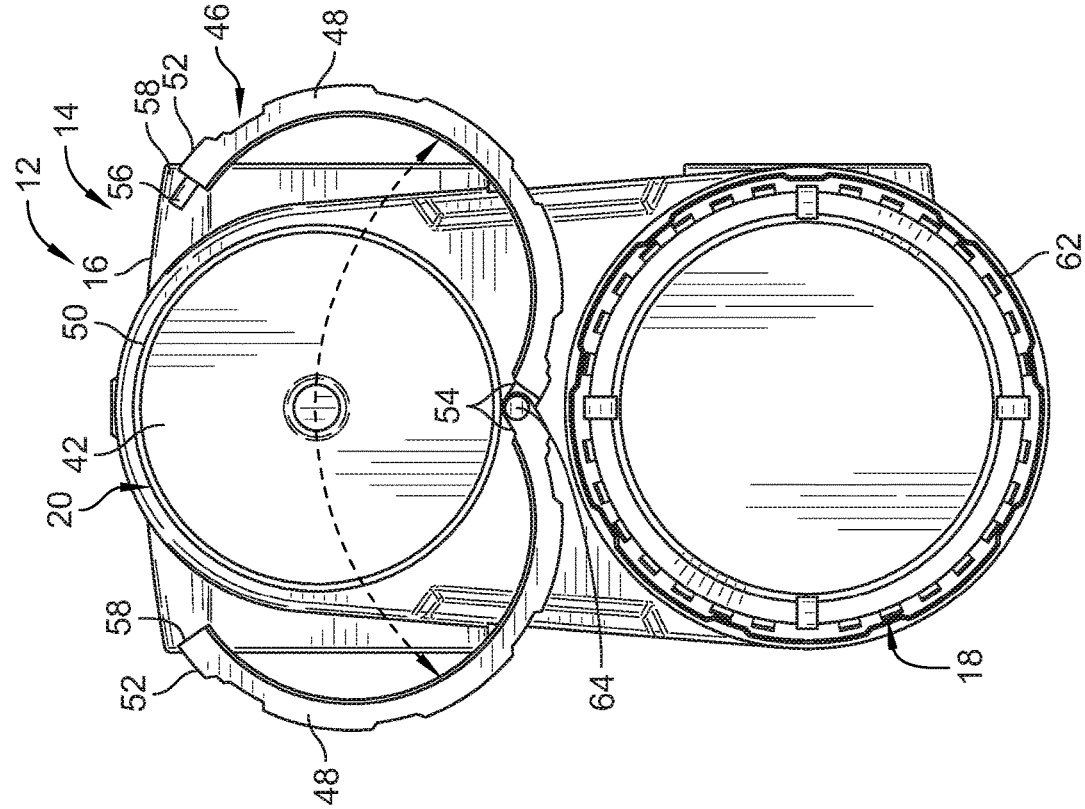
FIG. 4 is an elevation view of the explosion-resistant device of FIGS. 1-3, showing the clamp arranged in an open position to release the lid for removal from the access opening of the control compartment.

Referring now to FIG. 4, the clamp 46 is shown in the open position. In the illustrative embodiment, the terminal ends 54 of the clamp arms 48 are pivotably coupled together by a pin fastener 64. The pin fastener 64 is illustratively arranged connected with the housing 16 and extending therefrom to pivotably support the clamp arms 48. The pin fastener 64 is illustratively arranged on a lower end (relative to the orientation of FIG. 5) of the end flange 50 of the control compartment 20 such that the clamp arms 48 are arranged to the lateral sides of the end flange 50. In such arrangement, the weight of the clamp arms 48 can assist in biasing each clamp arm 48 into the open position while remaining coupled with the housing 16. Accordingly, the clamp 46 can be biased into the open position when the clamps arms 48 are disconnected from each other at the terminal ends 52 to provide ease of access to the access opening 44.

Figure 5:
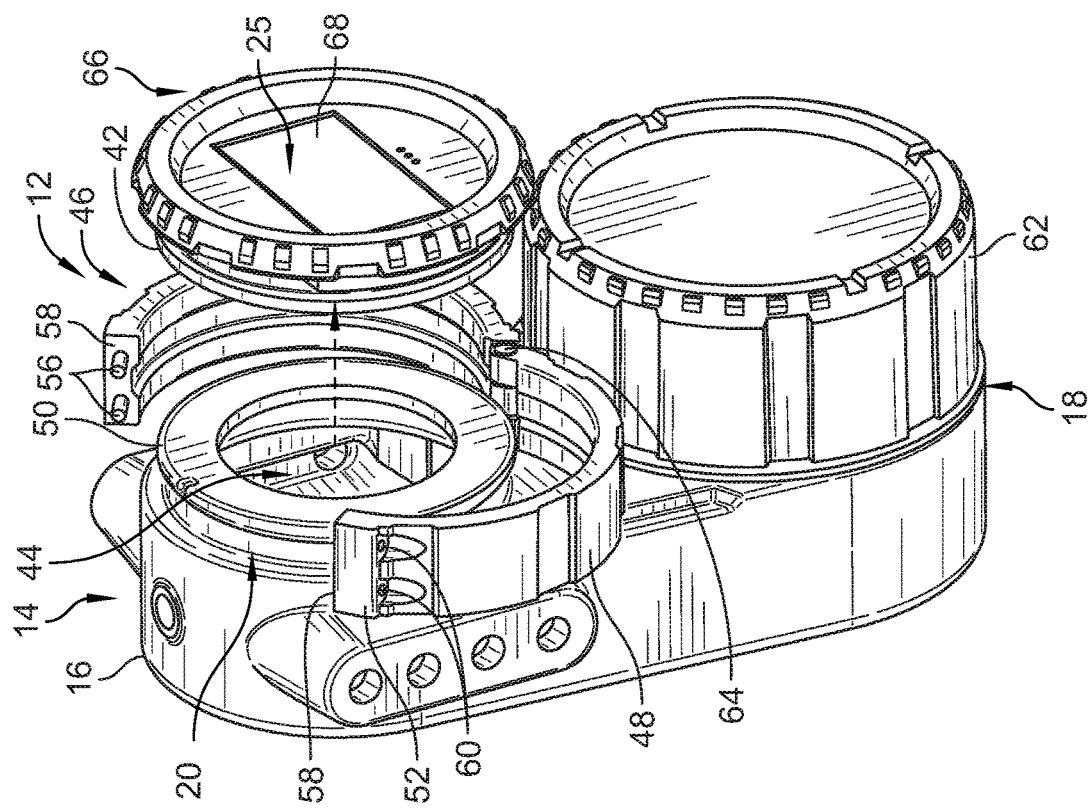
FIG. 5 is a perspective view of the explosion-resistant device of FIGS. 1-4, showing that the lid is joined with a display assembly to form a lid assembly, and showing that the display assembly includes a touchscreen interface display.

Referring to FIG. 5, the lid 42 is shown joined with the graphical display assembly 25 to form a lid assembly 66. As discussed in additional detail herein, the graphical display assembly 25 provides touchscreen interface for user input and display. The lid assembly 66 can be clamped, via the lid 42 and clamp 46, together with the control compartment 20.

Figure 6:
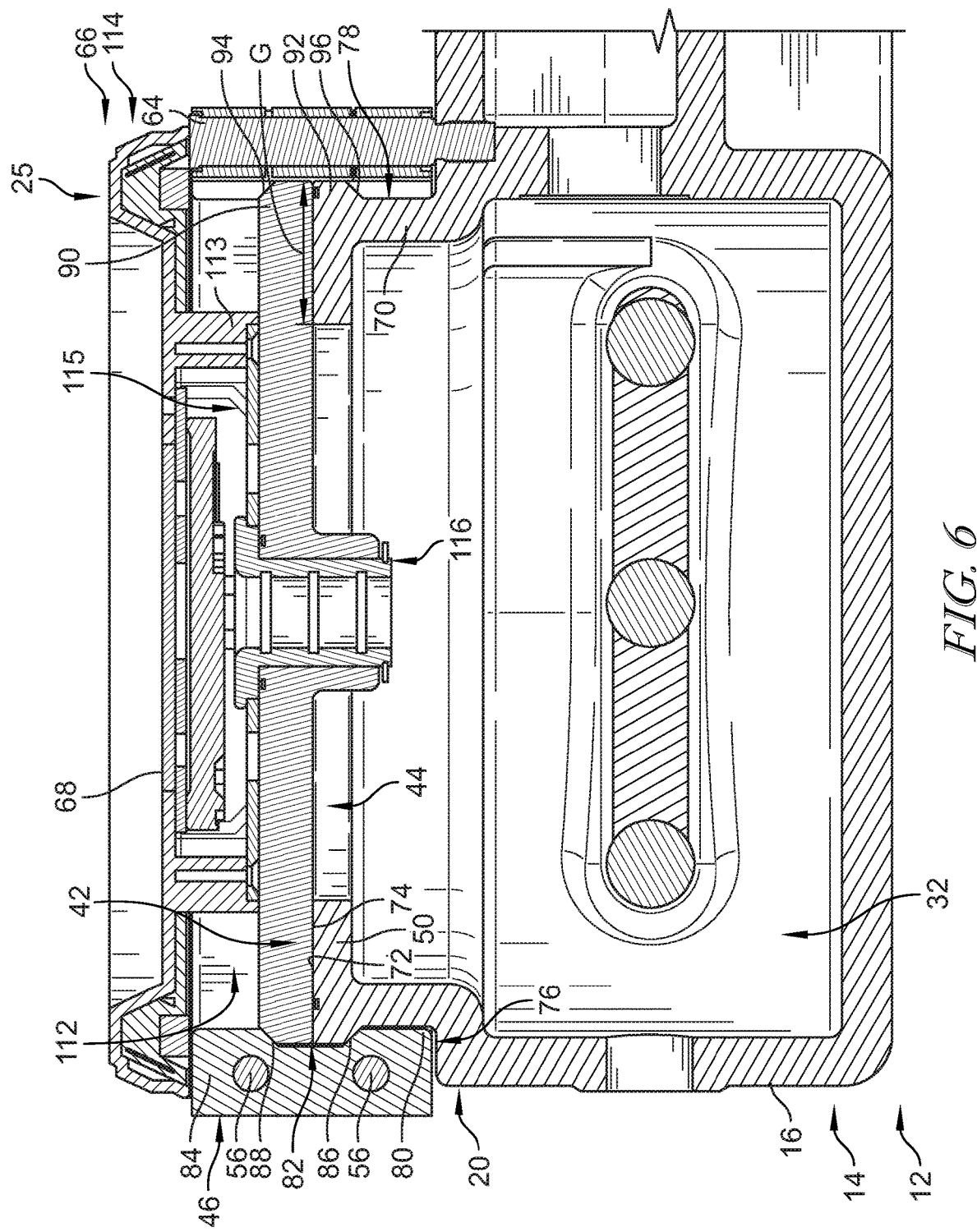
FIG. 6 is a cross-sectional view of the explosion-resistant device of FIGS. 1-5 taken along the plane 6-6 of FIG. 1, showing that a flame gap is defined between the lid and an engagement flange of the control compartment, and showing that a wedged engagement is formed between the clamp and the lid, and between the clamp and the engagement flange, each wedged engagements can press together the lid and the engagement flange under radial force of the clamp to encourage a tight fit at the flame gap.

Referring now to FIG. 6, a cross-section of a portion of the enclosure 14 is shown for ease of description. The lid assembly 66 is shown secured with the enclosure 14, enclosing the access opening 44. The lid 42 and the end flange 50 are engaged with each other to seal the access opening 44 of the control compartment 20.

The end flange 50 is supported by a flange wall 70 of the enclosure 14. The flange wall 70 extends from the housing 16, projecting towards the access opening 44. The end flange 50 extends generally orthogonally from the flange wall 70 to define a contact face 72 for engagement with the lid 42. The contact face 72 is illustratively defined circumferentially about the access opening 44 for engagement with a contact face 74 of the lid 42.

Engagement between the contact face 72 of the end flange 50 and the contact face 74 of the lid 42 defines a flame gap G for blocking against hazard of explosion. The flame gap G is illustratively defined as a circumferential flame gap, encircling the access opening 44. In the illustrative embodiment, the flame gap G is defined as a direct contact between two substantially flat surfaces, but in some embodiments, may have any suitable form, including but without limitation, plane, straight, flat, flanged, serrated, threaded, spigot, rabbet, multi-step, and/or labyrinth, such as, for example but without limitation, those conforming with one or more of IEC 60079-1 Ed 7.0 (2014-08) "Explosive atmospheres—Part 1: Equipment protection by flameproof enclosures "d""; CSA C22.2 No. 30:20 "Explosion-proof equipment"; and UL 2103 Fifth Edition (Nov. 22, 2013) "Standard for Safety Explosion Proof and dust-Ignition Proof Electrical equipment for Use in Hazardous (Classified) Locations."

In the illustrative embodiment as shown in FIG. 6, the flange wall 70 defines a receptacle 76 for receiving engagement of the clamp 46. The receptacle 76 is defined as depression formed on an outer surface 78 of the flange wall 70. The receptacle 76 illustratively extends circumferentially about the flange wall 70 to receive the clamp 46.

When the clamp 46 is clamped to secure the lid 42 and the control compartment 20 together, the receptacle 76 receives a rim 80 of the clamp 46. The clamp 46 includes a depression 82 defined on a radially inner surface between the rim 80 and another rim 84. A transition section 86, 88 is defined between each rim 80, 84 and the depression 82. Each transition section 86, 88 is formed as an inwardly sloped surface extending circumferentially for engagement with one of the lid 42 and the end flange 50.

Ends 90, 92 of the lid 42 and end flange 50, respectively, engage within the depression 82 of the clamp 46. The ends 90, 92 each include an outwardly sloped surface 94, 96 for engagement with one of the transition sections 86, 88 formed complementary thereto. Engagement between the outwardly sloped surface 94, 96 and the transition sections 86, 88 can press the together the lid 42 and the end flange 50 under radial compression by the clamp 46.

In the illustrative embodiment, the sloped surface 94 and the transition section 86 define a wedged engagement to encourage (press) the lid and the end flange 50 together. The sloped surface 96 and the transition section 88 define a wedged engagement to encourage (press) the lid 42 and the end flange 50 together. Each wedged engagement is arranged to transfer radial force from the clamp 46 into compressive force generally normal to the engagement between the lid 42 and end flange 50 (e.g., normal to the contact faces 72, 74 in the illustrative embodiment) to encourage a tight fit at the flame gap G.

Figure 7:
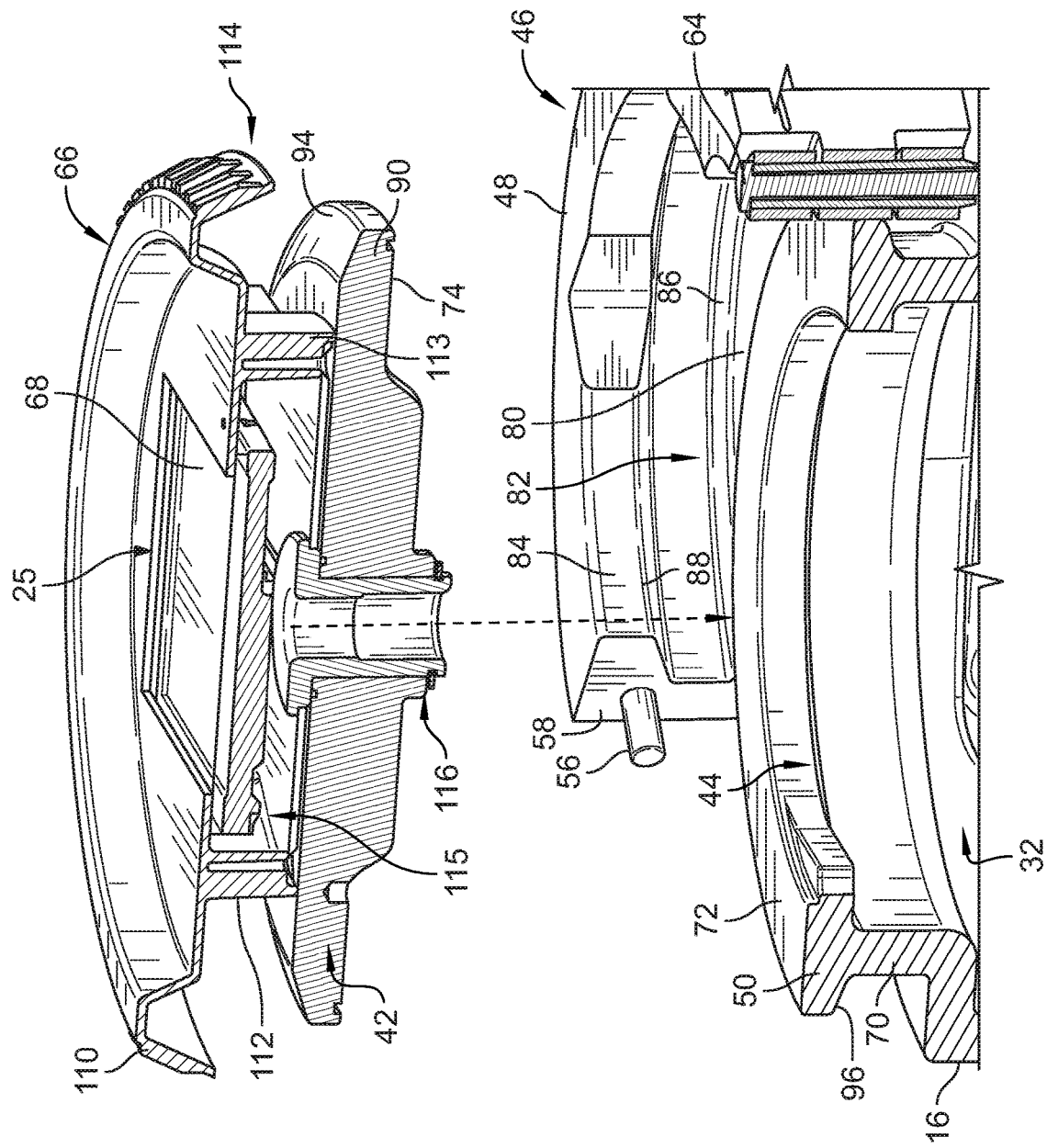
FIG. 7 is a perspective cross-sectional view of the explosion-resistant device of FIGS. 1-6 taken along the plane 6-6 of FIG. 1 with the clamp in an open position, showing that the lid assembly has been removed from the access opening of the control compartment.

Referring now to FIG. 7, the lid assembly 66 is shown in partial cross-section while spaced apart from the end flange 50. The display assembly 25 of the lid assembly 66 includes a bezel 110 connected with rear housing 112. In the illustrative embodiment, the rear housing 112 includes a number of arms 113 extending for connection with the bezel 110 for joining the bezel 110 and rear housing 112 together. The bezel 110 and rear housing 112 collectively define a display housing 114 comprising a display compartment 115 for receiving the display assembly 25.

The lid 42 includes a cable passage 116 defined therethrough for extension of cabling through the lid 42. The cable passage 116 is formed as a sealing passage, permitting the extension of cabling with gas-tight sealing to support communication with the control equipment while blocking against flow of fluids through the access opening 44.

Figure 9:
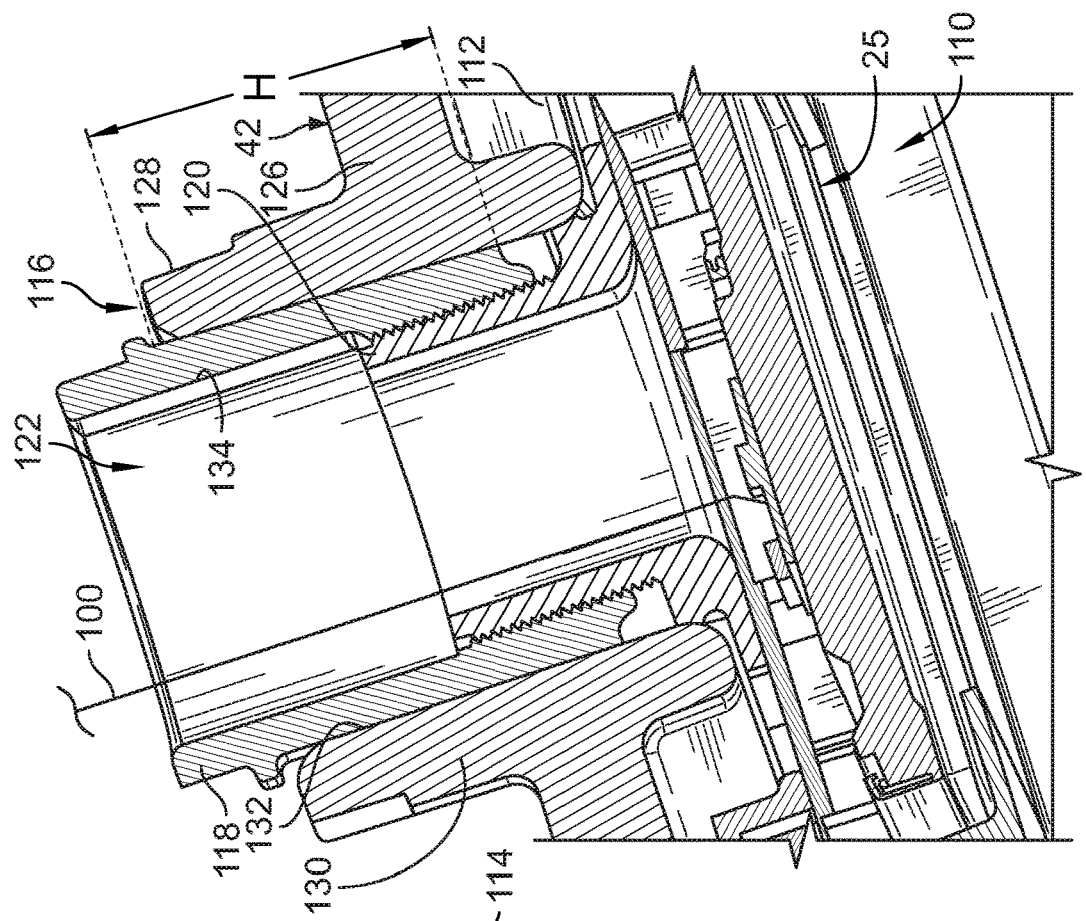
FIG. 9 is a close-up of a portion of the cross-sectional view of FIG. 7 of the explosion-resistant device of FIGS. 1-8, showing that the passage fitting and the lid collectively define a flame gap.
Figure 8:
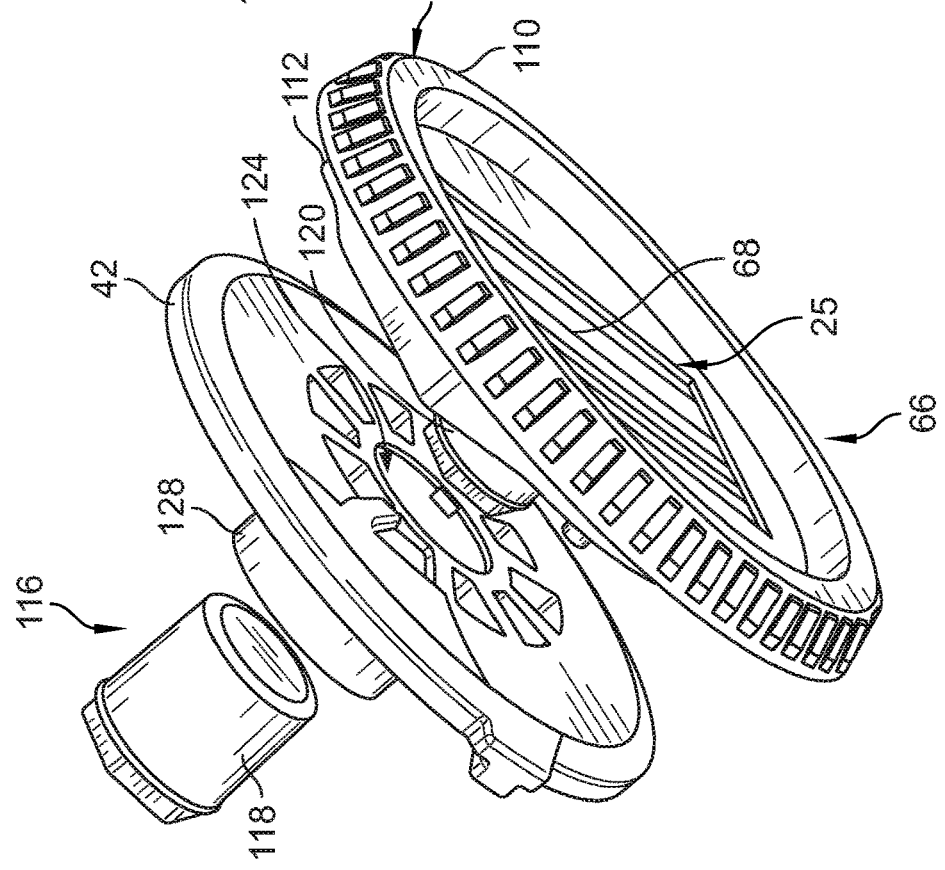
FIG. 8 is an exploded perspective view of the lid assembly of the explosion-resistant device of FIGS. 1-7, showing that a fastener engages with a display housing to form a passage fitting extending through the lid to connect the display assembly with the lid.

Referring to FIGS. 8 and 9, the display housing 114 is illustratively secured with the lid 42 to mount the display assembly 25 with the lid 42. The lid assembly 66 includes a fastener 118 which engages with the display housing 114 through the lid 42 to secure the lid 42 and display housing 114. Referring to FIG. 9, the rear housing 112 includes a stem 120 extending for connection with the fastener 118. The stem 120 and fastener 118 are illustratively connected together, to form a passage fitting, via threaded engagement to secure the display housing 114 with the lid 42. However, in some embodiments, the stem 120 and fastener 118 may be connected by any suitable manner.

Each of the fastener 118 and stem 120 are illustratively formed with hollow interior to define an open space 122 for passage of cabling 100 through the lid 42. The cabling can provide communication connection between the display assembly 25 and the control equipment within the control compartment 20, while the lid 42 encloses the access opening 44. With arrangement of cabling 100 through the space 122, the space 122 can be sealed, for example, by potting the cabling 100 into place define a gas tight arrangement, while permitting communication between the display assembly 25 and the control equipment.

The cable passage 116 is illustratively includes an opening 124 formed in a body 126 of the lid 42. The opening 124 is defined by a port 128 of the body 126. The port 128 includes a wall 130 extending from the body 126 to define the opening 124 to receive the stem 120 and fastener 118. The wall 130 includes an interior surface 132 for engagement with at least one of the stem 120 and fastener 118.

In the illustrative embodiment as shown in FIG. 9, the fastener 118 receives the stem 120 therein in threaded connection as a passage fitting, and thus an outer surface 134 of the fastener 118 engages with the interior surface 132 of the wall 130, but in some embodiments, either or both of the fastener 118 and the stem 120 may define the surface for engagement with the interior surface 132 of the wall 130. The complementary engagement between outer surface 134 of the passage fitting (illustratively, the fastener 118) and the interior surface 132 of the wall 130 defines a flame gap H.

The flame gap H is illustratively defined as a cylindrical flame gap, providing explosion resistance across the lid 62. In the illustrative embodiment, the flame gap H is defined as a direct contact between two substantially complementary surfaces (flat, although with complementary curvature to each other); but in some embodiments, the flame gap H may have any suitable form, including but without limitation, plane, straight, flat, flanged, serrated, threaded, spigot, rabbet, multi-step, and/or labyrinth, such as, for example but without limitation, those conforming with one or more of IEC 60079-1 Ed 7.0 (2014-08) "Explosive atmospheres—Part 1: Equipment protection by flameproof enclosures "d""; CSA C22.2 No. 30:20 "Explosion-proof equipment"; and UL 2103 Fifth Edition (Nov. 22, 2013) "Standard for Safety Explosion Proof and dust-Ignition Proof Electrical equipment for Use in Hazardous (Classified) Locations".

The flame gap H permits cabling to be installed through the lid 42, while providing a sealed communication connection between the display assembly 25 and the control equipment via the cabling 100. Unlike traditional approaches which may require the display screen itself to maintain significant explosion resistance, for example, through the use of thick glass for the screen itself, designs within the present disclosure can reduce the need for excessive configuration of the screen for explosion resistance, permitting more elegant display screens. Moreover, such elegant display screens can improve the usability of touchscreen interfaces.

Figure 10:
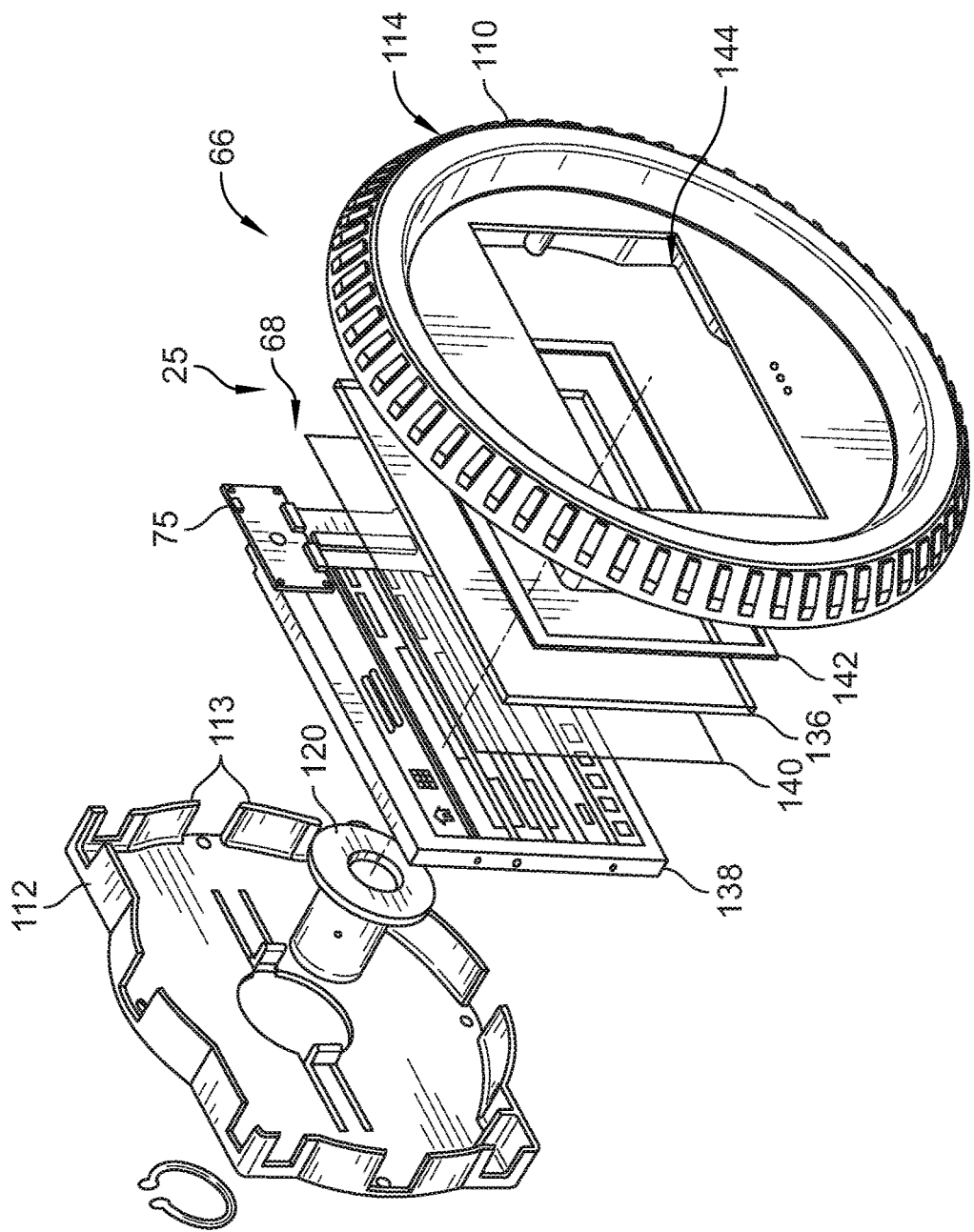
FIG. 10 is an exploded perspective view of the display assembly of the explosion-resistant device of FIGS. 1-9, showing that the touchscreen interface display includes a display and an outer face arranged for receiving touch sensitive user input.

As shown in FIG. 10, the lid assembly 66 is shown partially exploded for descriptive ease. The display assembly 25 includes the display screen 68 embodied as a touchscreen display. The display screen 68 illustratively includes a face plate 136, embodied as a transparent outer face plate, and a display 138 for engagement with the face plate 136. The face plate 136 forms an outer contact surface of the display screen 68 defining a touch sensitive area for receiving user input, while the graphical display of the display 138 is visible through the face plate 136. In some embodiments, the display screen 68 may be formed as merely a visual display, without touch input, and/or may include non-touch input access.

The display screen 68 includes a touch sensor board 75 in communication with the face plate 136 to receive and communicate touch input from the user. The face plate 136 is illustratively joined with the display 138 via an adhesive layer 140 arranged therebetween. The display assembly 25 illustratively includes a gasket 142 for arrangement between the face plate 136 and the bezel 110 for supporting the display screen 68 within the display housing 114. The display screen 68 is arranged within the display housing 114 for viewing and touch input through a display opening 144 in the bezel 110. In some embodiments, the display screen 68 may be encapsulated within the display housing, for example, by potting.

Accordingly, touchscreen operation can be implemented while maintaining the explosion-resistance of the enclosure 14. As mentioned above, traditional explosion resistant designs may have required significant explosion resistance in the display itself, for example, thick glass or plastic as the touchscreen surface. Thick touchscreen surfaces can themselves inhibit touchscreen operation, by lowering the sensitive of the capacitive touch surface to touch inputs. Designs within the present disclosure permit the use of a thin face plate in the touchscreen display, allowing greater, and more functional implementation of touchscreen operations.

Figure 11:
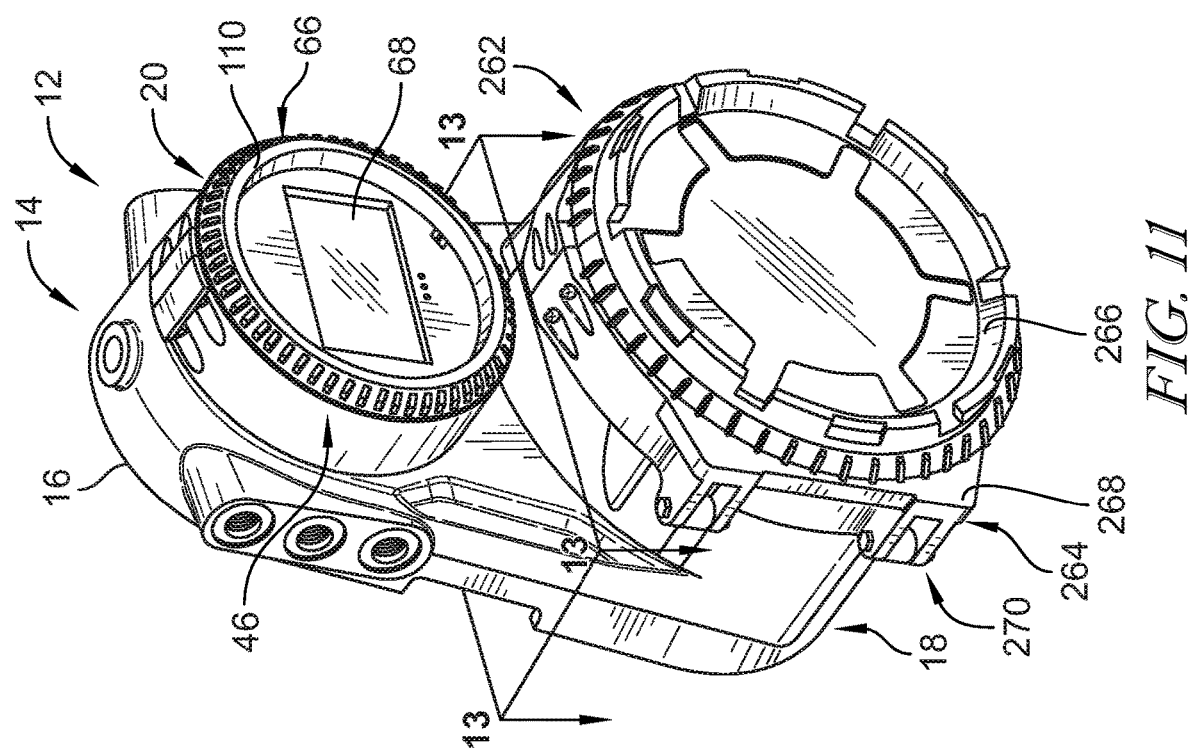
FIG. 11 is a perspective view of the explosion-resistant device of FIGS. 1-10, showing that the analysis compartment includes a lid assembly including a carriage and a lid received by the carriage, and showing that the lid assembly is in a closed position with the lid sealing the analysis compartment.

Referring now to FIG. 11, the device 12 having explosion-resistant enclosure 14 is shown, in which the analysis compartment 18 includes a lid assembly 262 in lieu of lid 62. The lid assembly 262 is illustratively embodied to be similar to the lid 62, and is arranged for enclosing the access opening 51 of the analysis compartment 18. Unlike the lid 62, the lid assembly 262 includes a carriage 264 pivotably connected with the housing 16 and a lid 266 received by the carriage 264.

Figure 12:
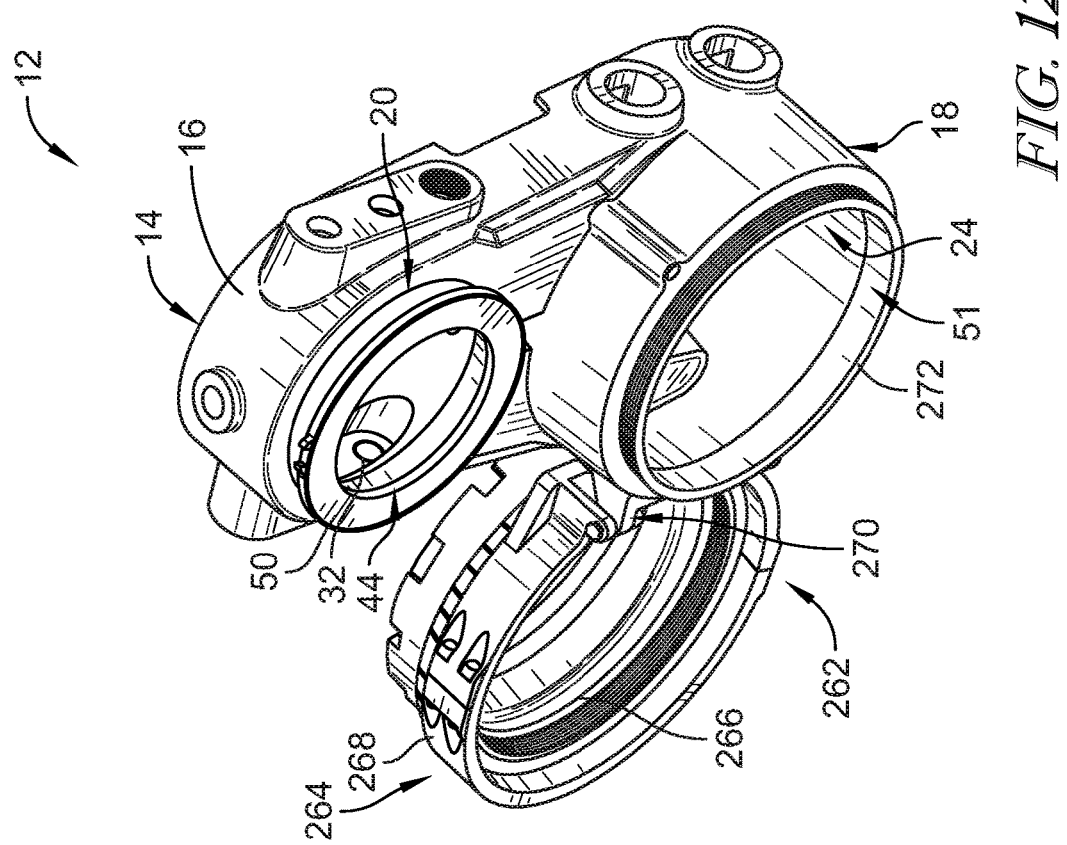
FIG. 12 is a perspective view of the explosion-resistant device of FIGS. 1-11 showing the lid assembly of the analysis compartment arranged in an open position to allow access to the analysis equipment through an access opening.

The lid assembly 262 is operable between closed and open positions. As shown in FIG. 11, the lid assembly 262 is arranged in the closed position, having the lid 266 in a sealed position sealing the access opening 51. As shown in FIG. 12, the lid assembly 262 is arranged in the open position, allow access to the access opening 51, and thus, the analysis equipment within the analysis compartment 18.

The carriage 264 illustrative includes a frame 268 for receiving the lid 266. The carriage 264 is pivotably connected with the housing 16 by a pinned connection 270. The carriage 264 is pivotable about the pinned connection 270 between the closed and opened positions to position the lid 266 to engage with the analysis compartment 18 or to allow access to the access opening 51, respectively.

As shown in FIG. 12, the analysis compartment 18 includes a connection flange 272 for engagement with the lid 266. The connection flange 272 is illustratively formed to circumferentially define the access opening 51. The lid 266 and the connection flange 272 collectively form a threaded engagement to selectively seal and unseal the analysis compartment 18.

Figure 13B:
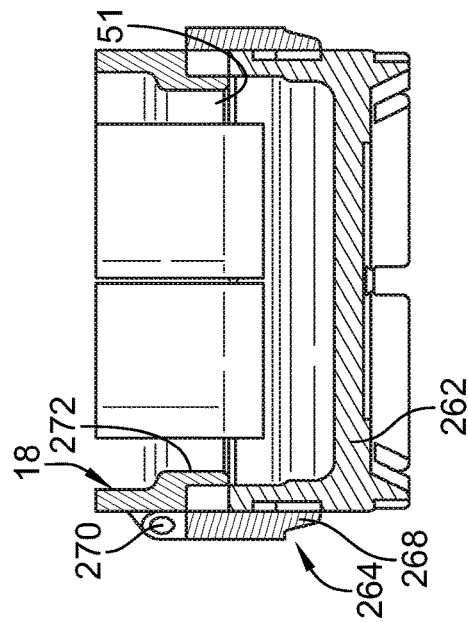
FIG. 13B is a cross-sectional view of the explosion-resistant device of FIGS. 1-12 from the same viewpoint as FIG. 13A, showing that the lid assembly is in the closed position and the lid is in an unsealed position, engaged but unthreaded with the connection flange of the control compartment.
Figure 13A:
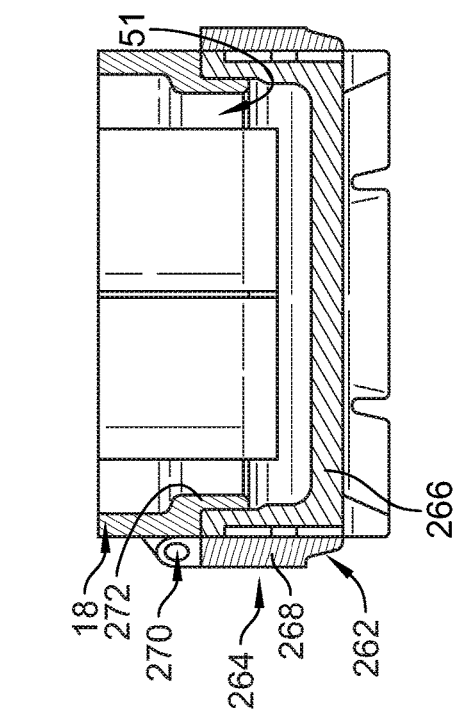
FIG. 13A is a cross-sectional view of the explosion-resistant device of FIGS. 1-12 taken along the plane 13-13 in FIG. 12, showing that the lid assembly is in the closed position and the lid is in a sealed position, threaded with a connection flange of the control compartment.

Referring now to FIG. 13A, the lid 266 is arranged in the sealed position to seal the analysis compartment 18. The lid assembly 262 is arranged in the closed position to engage with the connection flange 272, and the lid 266 has been rotated for threaded engagement with the connection flange 272 to form gas tight seal.

Figure 13C:
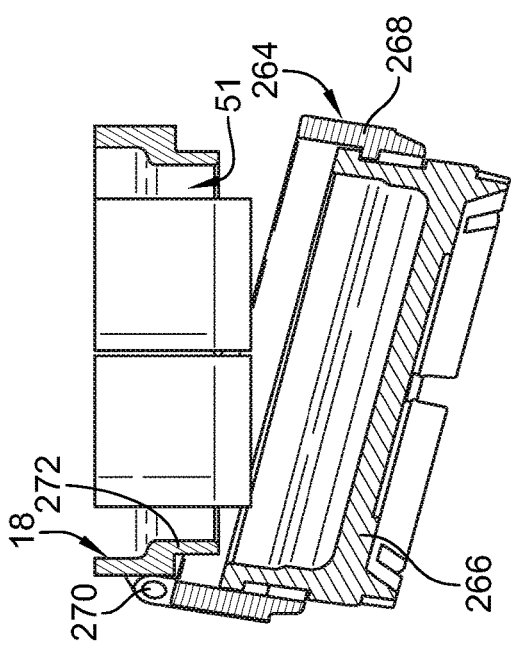
FIG. 13C is a cross-sectional view of the explosion-resistant device of FIGS. 1-12 from the same viewpoint as FIG. 13B, showing that the lid assembly has been moved towards the open position and the lid is in an unsealed position disengaged with the connection flange.

In FIG. 13B, the lid 266 is in the unsealed position. The lid 266 has been unthreaded from, but remains engaged with, the connection flange 272, while the lid assembly 262 is arranged in the closed position. In FIG. 13B, the lid 266 is positioned farther from the access opening 51 than in the sealed position as shown in FIG. 13A. In FIG. 13C, the lid assembly 262 has been pivoted out from the closed position towards the open position.

Within the present disclosure, implementation of a clamped lid closure can promote ease of access for touch-screen designs. For example, by allowing the lid 42 to avoid rotation which would be required for a threaded connection with the housing 16, twisting of cabling 100 can be avoided during closure of the enclosure 14. Accordingly, ease of access can be afforded while providing explosion-resistant design.

Within the present disclosure, designs including one control and one analysis compartment have been considered. However, in some embodiments, devices, systems, and methods may include one or more control compartments and one or more analysis compartments, for example, one control compartment arranged in communication with two or more analysis compartments, for example, via serial or parallel feed-throughs extending between the control compartment and the analysis compartments.

Examples of suitable processors may include one or more microprocessors, integrated circuits, system-on-a-chips (SoC), among others. Examples of suitable memory, may include one or more primary storage and/or non-primary storage (e.g., secondary, tertiary, etc. storage); permanent, semi-permanent, and/or temporary storage; and/or memory storage devices including but not limited to hard drives (e.g., magnetic, solid state), optical discs (e.g., CD-ROM, DVD-ROM), RAM (e.g., DRAM, SRAM, DRDRAM), ROM (e.g., PROM, EPROM, EEPROM, Flash EEPROM), volatile, and/or non-volatile memory; among others. Communication circuitry includes components for facilitating processor operations, for example, suitable components may include transmitters, receivers, modulators, demodulators, filters, modems, analog/digital (AD or DA) converters, diodes, switches, operational amplifiers, and/or integrated circuits.

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the methods, systems, and articles described herein. It will be noted that alternative embodiments of the methods, systems, and articles of the present disclosure may not include all of the features described yet still benefit from at least some of the advantages of such features. Those of ordinary skill in the art may readily devise their own implementations of the methods, systems, and articles that incorporate one or more of the features of the present disclosure.

The invention claimed is:
1. An explosion-resistant enclosure comprising:
an analysis compartment for receiving analysis equipment for analysis of materials;

a control compartment for receiving control equipment for governing operation of the analysis equipment, the control compartment isolated from the analysis compartment; and a feed-through extending between the analysis compartment and the control compartment for extension of cabling therethrough, the feed-through hermetically sealed to block against flow of fluids between the analysis compartment and the control compartment, wherein the analysis compartment and the control compartment are both accessible from a front side of the explosion-resistant enclosure.

2. The explosion-resistant enclosure of claim 1, wherein one or more of the feed-through, the analysis compartment, and the control compartment is explosion resistant.

3. The explosion-resistant enclosure of claim 1, wherein the control compartment comprises a control housing defining a control cavity for receiving the control equipment and an access opening for accessing the control cavity.

4. The explosion-resistant enclosure of claim 3, wherein the control compartment includes a lid for joining with the control housing to enclose the access opening.

5. The explosion-resistant enclosure of claim 4, wherein the control housing includes an end member for engagement with the lid, the access opening defined by the end member.

6. The explosion-resistant enclosure of claim 5, wherein the end member is supported by a flange wall extending from the control housing.

7. The explosion-resistant enclosure of claim 6, wherein the end member extends orthogonally from the flange wall to define an end face for engagement with the lid.

8. The explosion-resistant enclosure of claim 6, wherein the flange wall includes a receptacle defined on an outer surface thereof for receiving a clamp.

9. The explosion-resistant enclosure of claim 8, wherein at least one of the flange wall and the lid includes a sloped surface extending circumferentially for engagement with the clamp.

10. The explosion-resistant enclosure of claim 5, wherein the end member engages with the lid to define a flame gap extending circumferentially about the access opening.

11. The explosion-resistant enclosure of claim 10, wherein the analysis compartment includes a clamp for securing the lid with the control housing.

12. The explosion-resistant enclosure of claim 11, wherein the clamp includes a number of clamp arms extending circumferentially about each of the lid and the end member.

13. The explosion-resistant enclosure of claim 12, wherein each of the clamp arms include circumferential ends, wherein the circumferential ends of a pair of the clamp arms are selectively fastened with each other to clamp the lid and the end member together.

14. The explosion-resistant enclosure of claim 13, wherein each one of the pair of the clamp arms includes another circumferential end, and the another circumferential ends of the pair of the clamp arms are pivotably coupled together.

15. The explosion-resistant enclosure of claim 13, wherein the clamp includes a fastener pivotably coupling the clamp arms together, the fastener secured with a housing of the explosion-resistant enclosure to support the clamp arms for movement between an open position free from the end member and a closed position clamped about the end member to clamp the lid and the end member together.

16. The explosion-resistant enclosure of claim 11, wherein the clamp includes a radial depression for receiving a circumferential portion of each of the lid and the end member.

17. The explosion-resistant enclosure of claim 16, wherein the radial depression is defined with one or more inwardly sloped surfaces of the clamp, each inwardly sloped surface arranged for engagement with one of the lid and the end member to press the lid and the end member together under radially inward pressure of the clamp.

18. The explosion-resistant enclosure of claim 17, wherein the end member is supported by a flange wall extending from the control housing, and wherein at least one of the flange wall and the lid includes an outwardly sloped surface extending circumferentially for engagement with the one or more inwardly sloped surfaces of the clamp to press the lid and the end member together under radially inward pressure of the clamp.

19. The explosion-resistant enclosure of claim 4, wherein the lid includes a cable passage for extension of interface cabling therethrough, the cable passage defining a flame gap.

20. The explosion-resistant enclosure of claim 19, wherein the lid is defined as a part of a lid assembly comprising a display screen for graphical display, the display screen including cabling extending through the cable passage for communication with the control equipment.

21. The explosion-resistant enclosure of claim 20, wherein the display screen may include a touch screen for receiving touch sensitive user input.

22. An explosion-resistant device comprising:
an explosion-resistant enclosure;
analysis equipment for analysis of samples, the analysis equipment arranged within the explosion-resistant enclosure; and
control equipment for governing control of the analysis equipment,
wherein the explosion-resistant enclosure comprises:
an analysis compartment receiving the analysis equipment;
a control compartment receiving the control equipment, the control compartment isolated from the analysis compartment; and
a feed-through extending between the analysis compartment and the control compartment for extension of cabling therethrough, the feed-through hermetically sealed to block against flow of fluids between the analysis compartment and the control compartment,
wherein the analysis compartment and the control compartment are both accessible from a front side of the explosion-resistant enclosure.

* * * * *